United States Patent [19]

Plus

[11] Patent Number: 4,758,744
[45] Date of Patent: Jul. 19, 1988

[54] DECODER CIRCUITRY WITH REDUCED NUMBER OF INVERTERS AND BUS LINES

[75] Inventor: Dora Plus, South Bound Brook, N.J.

[73] Assignee: RCA Corporation, Princeton, N.J.

[21] Appl. No.: 935,389

[22] Filed: Nov. 26, 1986

[51] Int. Cl.$^4$ .......................................... H03K 19/094
[52] U.S. Cl. .................................... 307/449; 307/451; 307/463
[58] Field of Search ............... 307/443, 448, 449, 451, 307/463, 584, 585; 365/230

[56] References Cited

U.S. PATENT DOCUMENTS

| | | | |
|---|---|---|---|
| 4,259,731 | 3/1981 | Moench | 307/463 X |
| 4,292,547 | 9/1981 | Pfiester et al. | 307/463 |
| 4,309,629 | 1/1982 | Kamuro | 307/449 |
| 4,479,126 | 10/1984 | Higuchi et al. | 307/449 X |
| 4,538,247 | 8/1985 | Venkateswaran | 365/230 |
| 4,583,205 | 4/1986 | Watanabe | 307/449 X |
| 4,620,117 | 10/1986 | Fang | 307/443 X |
| 4,631,425 | 12/1986 | Koshimaru | 307/449 |
| 4,633,220 | 12/1986 | Burgess | 307/463 X |
| 4,684,829 | 8/1987 | Uratani | 307/443 X |

OTHER PUBLICATIONS

Lipa, "Low Power CMOS NOR Decoder for Automatically Powering Down Unselected Decoders", *IBM T.D.B.*, vol. 27, No. 6, Nov. 1984, pp. 3203-3204.

Moore et al., "Metal Oxide Transistor Decode Circuit" *IBM T.D.B.*, vol. 9, No. 6, Nov. 1966, pp. 703-704.

*Primary Examiner*—Stanley D. Miller
*Assistant Examiner*—D. R. Hudspeth
*Attorney, Agent, or Firm*—Henry I. Steckler; Allen LeRoy Limberg

[57] ABSTRACT

A decoder circuit for fully decoding N input variables includes $2^N$ logic gates arranged into $2^{N-1}$ pairs of gates, with each gate having N inputs, and one output. The decoder also includes (N−1) inverters for producing the complements of N−1 of the N input variables whereby the (N−1) input variables and their complements are arranged into $2^{(N-1)}$ different combinations of (N−1) signals for generating a different combination of (N−1) signals per pair of logic gates. (N−1) inputs of each of the two gates forming a pair of gates are interconnected to receive the same N−1 input signals forming one of the $2^{N-1}$ combinations. The Nth input variable is applied to the Nth input of one gate from each pair of gates and the output of the one gate from each pair is connected to the Nth input of the other gate with which it is paired.

7 Claims, 5 Drawing Sheets

DECODER CIRCUITRY WITH REDUCED NUMBER OF INVERTERS AND BUS LINES

This invention relates to logic circuitry and, in particular, to improved logic circuitry suitable for decoding binary coded inputs.

The theory pertaining to the decoding of binary signals as well as circuitry for implementing decoding functions is well known in the art. For example, it is known that N input variables may be decoded by means of $2^N$ logic gates to produce $2^N$ unique outputs. Typically, the N input variables are applied to N inverters to produce the complements of the N input variables. The N input variables and their complements are then combined into $2^N$ different combinations of N signals. Each one of the $2^N$ different combinations is then applied to a different one of $2^N$ logic gates, each having N inputs, to produce the $2^N$ unique outputs.

For ease of illustration and explanation, FIG. 1 shows a known decoding circuit in which two input variables ($A_0$ and $A_1$) and their complements ($\overline{A_0}$ and $\overline{A_1}$) are applied to a NAND'ing type circuit to produce four unique outputs (Z1, Z2, Z3 and Z4). The two input variables $A_0$ and $A_1$ are respectively applied to the inputs of two inverters (I0 and I1) to produce their respective complementary signals $\overline{A_0}$ and $\overline{A_1}$. The signals, $A_0$, $\overline{A_0}$, $A_1$, and $\overline{A_1}$ are then distributed via four separate lines L1, L2, L3 and L4 to the various branches of the circuit which, because of its structure is known in the art as a "tree" or "shrub" decoder.

The structure and operation of the circuit of FIG. 1, will now be discussed in detail in order to better understand the description of the invention to follow. In the discussion to follow, insulated-gate field-effect transistors (IGFETs) of P-conductivity tape are identified by the letter P followed by a particular reference numeral, and IGFETs of N-conductivity type are identified by the letter N followed by a particular reference numeral.

Analysis of the circuit of FIG. 1, reveals that it includes four (4) two-input NAND gates, NG1, NG2, NG3 and NG4, with each NAND gate having an output (Zi), and that gates NG1 and NG2 share a common input transistor N1 and gates NG3 and NG4 share a common input transistor N5.

NAND gate NG1 includes transistors N1, P1 and N2, P2 with the signal $\overline{A_0}$ being applied to one input (i.e. the gate electrodes of P2 and N2) of NG1 and the signal $\overline{A_1}$ being applied to the other input (i.e. the gate electrodes of P1 and N1) of NG1. NG2 includes transistors N1, P4 and N3, P3 with signal $\overline{A_0}$ being applied to one input (i.e. the gate electrodes of P3 and N3) of NG2 and $A_1$ being applied to the other input (i.e. the gate electrodes of N1 and P4) of NG2. NG3 includes transistors N5, P5 and N6, P6 with signal $\overline{A_0}$ being applied to one input of NG3 (i.e. the gate electrodes of P6 and N6) and with signal $A_1$ being applied to the second input (i.e. the gate electrodes of P5 and N5) of NG3. NG4 includes transistors N5, P8 and N7, P7 with signal $A_0$ being applied to one input (i.e. the gate electrodes of P7 and N7) of NG4 and $A_1$ being applied to the other input (i.e. the gate electrodes of N5 and P8) of NG4.

In the "tree" decoder of FIG. 1, output nodes 21 and 25 at which are generated output signals Z1 and Z2, respectively, are coupled via the conduction paths of transistors N2 and N3, respectively, to an intermediate node 19. Likewise, output nodes 29 and 31, at which are respectively produced signal outputs Z3 and Z4, are coupled via the conduction paths of transistors N6 and N7, respectively, to an intermediate node 27. Intermediate node 19 is coupled via the conduction path of transistor N1 to ground terminal 17 and intermediate node 27 is coupled via the conduction path of transistor N5 to terminal 17. The conduction paths of the two P-type insulated-gate field-effect transistors (IGFETs) of each gate (NGi) are connected in parallel between the gate output (Zi) and a power terminal 15 to which is applied an operating potential of $V_{DD}$ volts.

The operation of the circuit of FIG. 1 is known and need not be greatly detailed. Suffice it to say that:

1 - When $A_0$ and $A_1$ are both high, the output signal, Z1, is driven "low", arbitrarily defined as logic "Lo" or logic "0". If one, or both, of $A_0$ and $A_1$ is low, Z1 is driven "high", arbitrarily defined as logic "Hi" or logic "1";

2 - When $A_0$ and $\overline{A_1}$ are both high, the output signal, Z2, is low, otherwise Z2 is high;

3 - When $\overline{A_0}$ and $A_1$ are both high, the output signal, Z3, is low, otherwise Z3 is high; and 4 - When $\overline{A_0}$ and $\overline{A_1}$ are both high, Z4 is driven low; otherwise when any one of $\overline{A_0}$ and $\overline{A_1}$ is not high, Z4 is driven high.

Thus, in the circuit of FIG. 1, each output (Zi) is driven to a relatively low operating potential, for a particular, unique, combination of the input variables, $A_0$ and $A_1$, as summarized in Table 1 below.

TABLE 1

| $A_0$ | $A_1$ | $\overline{A_0}$ | $\overline{A_1}$ | Z1 | Z2 | Z3 | Z4 |
|---|---|---|---|---|---|---|---|
| 0 | 0 | 1 | 1 | Hi | Hi | Hi | Lo |
| 1 | 0 | 0 | 1 | Hi | Hi | Lo | Hi |
| 0 | 1 | 1 | 0 | Hi | Lo | Hi | Hi |
| 1 | 1 | 0 | 0 | Lo | Hi | Hi | Hi |

The four unique outputs (Z1, Z2, Z3 and Z4) produced from the two input variables ($A_0$ and $A_1$) may be expressed as follows:

$$Z1 = \overline{A_0 \cdot A_1} \qquad \text{eq. 1}$$

$$Z2 = \overline{A_0 \cdot \overline{A_1}} \qquad \text{eq. 2}$$

$$Z3 = \overline{\overline{A_0} \cdot A_1} \qquad \text{eq. 3}$$

$$Z4 = \overline{\overline{A_0} \cdot \overline{A_1}} \qquad \text{eq. 4}$$

In the decoding circuit of FIG. 1, the gates are paired (i.e. NG1 and NG2; NG3 and NG4) to reduce the transistor count with each pair of gates sharing a transistor. Thus, N1 is common to NG1 and NG2 and N5 is common to NG3 and NG4. Although the circuit of FIG. 1 includes a reduced number of transistors, each gate is driven by two signals, where each signal is either an input variable or the complement of an input variable. Thus, the FIG. 1 decoder requires two inverters (I0 and I1) to produce the complementary signals $\overline{A_0}$ and $\overline{A_1}$ of the input variables and four signal buses, or lines, (i.e., L1, L2, L3 and L4) to distribute the four signals $\overline{A_0}$, $A_1$, $A_1$ and $\overline{A_1}$ to the various branches of the decoder.

Applicant discovered that the decoding function could be accomplished without the need to generate the complements of all the input variables thereby reducing the number of inverters and the number of bus lines needed to distribute the signals to the various decoding gates.

This is significant since a primary goal in circuit design is the reduction of the number of components and buses needed to produce any particular function. That is so because each component and bus takes up space and thereby limits the density of the integrated circuit on which the circuit is formed. Also, using fewer components and buses per function results in higher yields.

Using the circuit of FIG. 1, as an example, Applicant recognized that the decoded output (i.e. Z1) of the first NAND gate could be applied to one input (i.e. the gate electrodes of P3 and N3) of the second NAND gate, instead of the signal $\overline{A_0}$, and that, likewise, the decoded output (i.e. Z3) of the third NAND gate could be applied to one input (i.e. the gate electrodes of P7 and N7) of the fourth NAND gate, instead of the signal $\overline{A_0}$, to produce decoded outputs (i.e. Z2 and Z4) at the outputs of the second and fourth gates which are logically identical to the case where $\overline{A_0}$ is applied. Thus, in accordance with Applicant's invention, to fully decode two input variables requires one inverter to produce the complement of one of the two input variables and three bus lines to distribute the three signals (i.e. the two input variables and the complement of one of the two variables) to the various decoding gates (or branches) of the circuit. Hence, in comparison to the prior art circuit of FIG. 1 which requires two inverters and four (4) bus lines to fully decode two input variables, circuits embodying the invention require only one inverter and three (3) bus lines to fully decode two input variables.

In general, in circuits embodying the invention, N input variables are fully decoded by means of $2^N$ logic gates arranged in $2^{N-1}$ pairs of logic gates with each logic gate having N inputs and at least one output. The input signals applied to the logic gates are generated by applying $N-1$ of the N input variables to $(N-1)$ inverters to generate $(N-1)$ complements of the $(N-1)$ input variables. The $(N-1)$ input variables and their $(N-1)$ complements are arranged into $2^{(N-1)}$ different combinations of $(N-1)$ signals to produce one combination of $(N-1)$ signals per pair of logic gates. Each combination of $(N-1)$ signals is applied to $(N-1)$ inputs of each one of the two logic gates forming a pair of logic gates. The Nth input variable is applied to the Nth input of one logic gate taken from each pair of the $2^{N-1}$ pairs of logic gates and the output of the one logic gate of each pair is applied to the Nth input of the other logic gate of that pair.

In the accompanying drawing, like reference characters denote like components; and FIG. 1 is a schematic diagram of a prior art decoder circuit;

Figure 1:
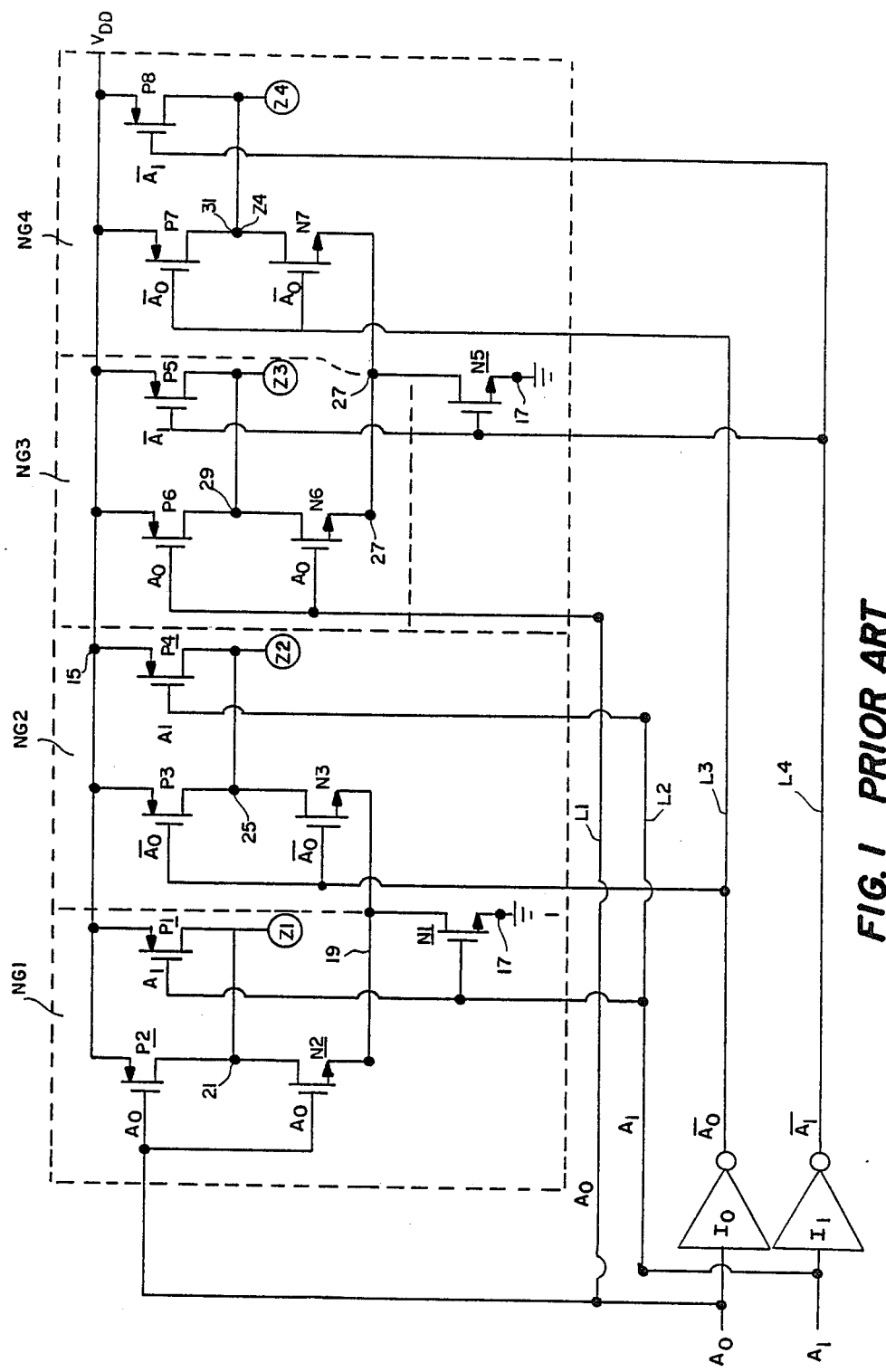
Figure 2:
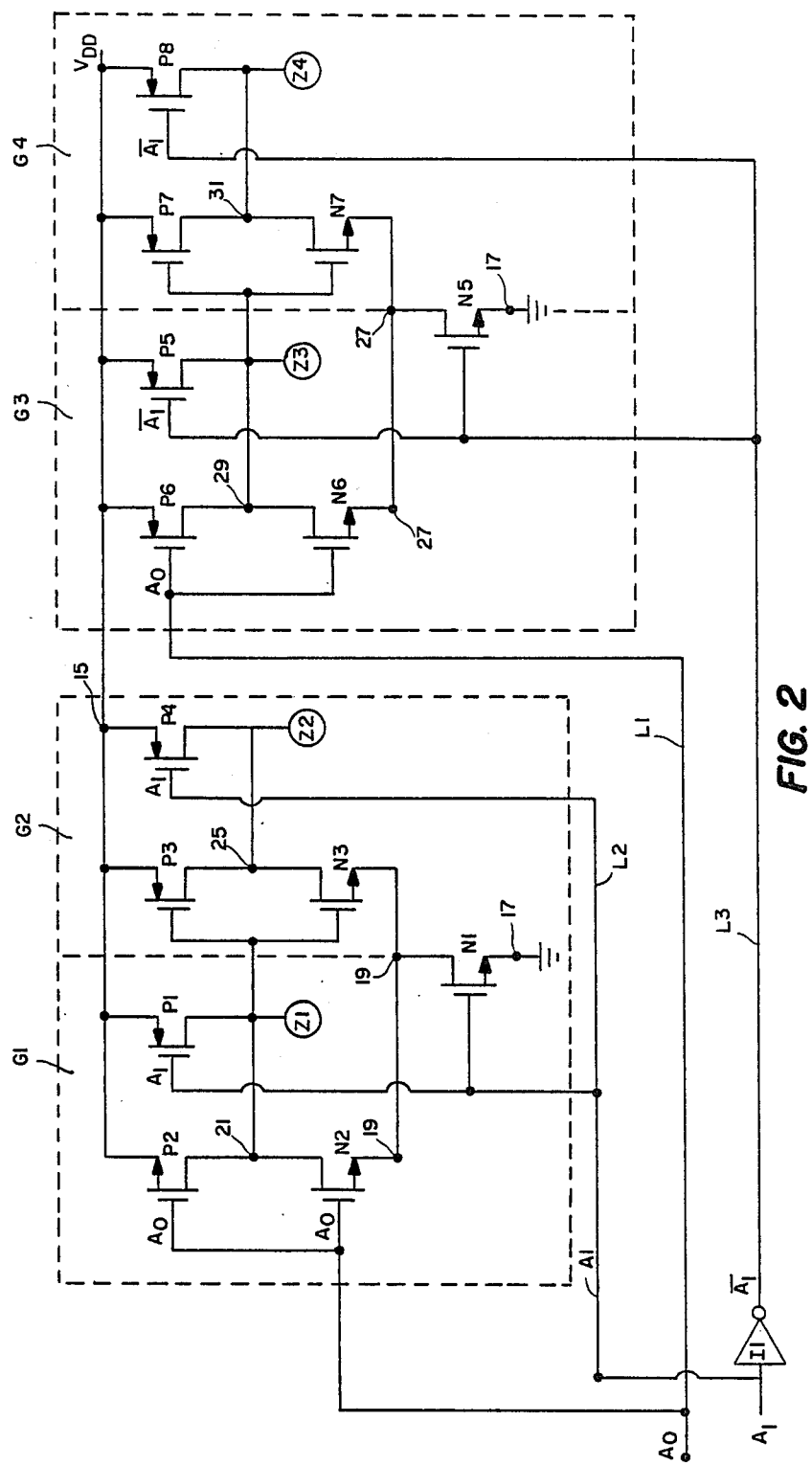
FIG. 2 is a schematic diagram of a decoder circuit embodying the invention.

The invention is best explained and understood by reference to the circuit of FIG. 2, which also shows a "tree" or shrub decoder for fully decoding two input variables, $A_0$ and $A_1$. In FIG. 2, as in FIG. 1, there are four logic gates (G1, G2, G3 and G4), with each logic gate (Gi) having two inputs and one output (Zi). In FIG. 2, as in FIG. 1, logic gates G1 and G2 share a common transistor N1 and logic gates G3 and G4 share a common transistor N5.

Gate G1 includes transistors N1, P1, N2 and P2 with the gate electrodes of P1 and N1 defining one input of G1 and the gate electrodes of P2 and N2 defining the second input of G1. As in FIG. 1, signals $\overline{A_0}$ and $\overline{A_1}$ are applied to two inputs of G1.

Gate G2 includes transistors N1, P4, N3 and P3 with the gate electrodes of N1 and P4 defining one input of G2 and the gate electrodes N3 and P3 defining the second input of G2. In contrast to the circuit of FIG. 1, in FIG. 2 the output Z1 of G1 is applied to one input of G2 by connecting node 21 to the gate electrodes of P3 and N3 and the signal $A_1$ is applied to the second input of G2.

Gate G3 is comprised of transistors N5, P5, N6 and P6 with the gate electrodes of N6 and P6 defining one input of G3 and the gate electrodes of P5 and N5 defining the second input of G3. As in the circuit of FIG. 1, signals $A_0$ and $\overline{A_1}$ are applied to the two inputs of G3.

Gate G4 includes transistors N5, P8, N7 and P7 with the gate electrodes of P8 and N5 defining one input of G4 and the gate electrodes of P7 and N7 defining the second input of G4. In contrast to the circuit of FIG. 1, in FIG. 2 the output, Z3, of G3 is applied to one input of G4 by connecting output node 29 to the gate electrodes of P7 and N7 and the signal $\overline{A_1}$ is applied to the second input of G4.

Output nodes 21 and 25 at which are produced outputs Z1 and Z2, respectively, are coupled via the conduction paths of IGFETs N2 and N3, respectively, to an intermediate node 19 and the conduction path of IGFET N1 is coupled between node 19 and terminal 17 to which is applied ground potential. Similarly, output nodes 29 and 31, at which are produced outputs Z3 and Z4, respectively, are coupled via the conduction paths of IGFETs N6 and N7, respectively, to an intermediate node 27 and the conduction path of IGFET N5 is connected between node 27 and terminal 17. IGFETs P1 and P2 have their conduction paths connected in parallel between terminal 21, at which is produced Z1, and terminal 15. IGFETs P3 and P4 have their conduction paths connected in parallel between terminal 25, at which is produced Z2, and terminal 15. IGFETs P5 and P6 have their conduction paths connected in parallel between terminal 29, at which is produced Z3, and terminal 15. IGFETs P7 and P8 have their conduction paths connected in parallel between terminal 31, at which is produced Z4, and terminal 15

In FIG. 2, as in FIG. 1, signals $\overline{A_0}$ and $\overline{A_1}$ are applied to the two inputs of G1 and input signals $A_0$ and $A_1$ are applied to the two inputs of G3. Thus, in FIG. 2, the outputs, Z1 and Z3, are produced in the same manner as in the prior art circuit of FIG. 1.

As noted above, a significant difference between the circuit of FIG. 2 and the prior art circuit of FIG. 1 is that, in FIG. 2, the signal applied to one input of G2 is the output (Z1) of a paired gate G1 and the signal applied to one input of G4 is the output (Z3) of a paired gate G3.

Nevertheless, as will be demonstrated below, the output signal Z2 produced at output terminal 25 of G2 and the output signal Z4 produced at output terminal 31 of G4 are logically identical to the like labeled signals Z2 and Z4 produced in the prior art circuit of FIG. 1. However, in contraast to the circuit of FIG. 1, in FIG. 2, Z2 and Z4 are produced without the need for a bus to distribute that signal. Thus, in the circuit of FIG. 2, a single inverter I1 is needed to invert the input variable $\overline{A_1}$ to produce $A_1$ and only three buses, L1, L2 and L3, are needed to distribute the signals $\overline{A_0}$, $A_1$ and $\overline{A_1}$ among the various segments or branches of the decoder circuit.

Examination of the circuit of FIG. 2 indicates that the output Z1 of G1 is identical to the output Z1 of NG1 in FIG. 1. When $A_0$ and $A_1$ are both high, N2 and N1 are turned on and P2 and P1 are turned off. The output, Z1, is then clamped at, or close to, ground potential, which is arbitrarily defined herein as logic "0". When either one, or both, of $\overline{A_0}$ and $\overline{A_1}$ is, or are, low, at least one of N1 and N2 is turned-off and at least one of P1 and P2 is turned-on. The output Z1 is then clamped at, or close to, $V_{DD}$ volts which is arbitrarily defined herein as "high" logic "1".

Signals Z1 and A1 are applied to the two inputs of G2 since Z1 depends on the values of $A_0$ and $\overline{A_1}$, the operation of G2 may be analyzed as a function of $A_0$ and $A_1$. When $\overline{A_1}$ is high, N1 is turned-on while P1 and P4 are turned-off. When $\overline{A_0}$ is high (i.e. $A_0$ is low), N2 is turned-on while P2 is turned-on causing the turn-on of N3 and the turn-off of P3. Thus, for the condition of $A_1$ and $\overline{A_0}$ being both high, N1 and N3 are turned-on and the output Z2 is clamped to, or close to, ground potential. When $\overline{A_1}$ is low, P4 is turned-on and N1 is turned-off whereby Z2 is high regardless of the value of Z1. When $A_0$ is low (i.e. $\overline{A_0}$ is high), P2 is turned-off while N2 is turned-on. The turn-on of N2 turns-off N3. Thus, when either one (or both) of $\overline{A_1}$ and $\overline{A_0}$ is low at least one (or both) of N1 and N3 is turned-off and at least one (or both) of P3 and P4 is turned-on whereby Z2 is clamped to, or close to, $V_{DD}$ volts. Z2 generated in G2 of FIG. 2 is thus logically equivalent to Z2 generally in the circuit of FIG. 1. The equivalence may be demonstrated mathematically. With Z1 and $A_1$ applied to the two inputs of G2, the output Z2 of G2 may be expressed in terms of Z1 and $A_1$ as follows:

$$Z2 = \overline{Z1 \cdot A_1} \qquad \text{eq. 5}$$

By inserting into equation 5 the value of Z1 from equation 1, equation 5 may be rewritten as follows:

$$Z2 = \overline{(\overline{A_0 \cdot A_1}) \cdot A_1} \qquad \text{eq. 6}$$

By the applicatio of DeMorgan's theorem, equation 6 reduces to the following:

$$Z2 = \overline{(\overline{A_0} + \overline{A_1}) \cdot A_1} \qquad \text{eq. 7}$$

Equation 7 then reduces to the following:

$$Z2 = \overline{\overline{A_0} \cdot A_1} \qquad \text{eq. 8}$$

Equation 8 is identical to equation 2 above. Hence, it is evident that Z2 produced in the circuit of FIG. 2 is logically identical to Z2 produced in the circuit of FIG. 1.

The output Z3 produced at output 29 of G3 in FIG. 2 is identical to the output Z3 in circuit of FIG. 1 which is equal to $A_0 \cdot \overline{A_1}$ as expressed in equation 3 above.

Signals Z3 and $\overline{A_1}$ are applied to the two inputs of G4. Examining the operation of G4 in detail reveals that when $A_0$ is high (i.e. $\overline{A_0}$ is low) P6 is turned-on and N6 turned-off. The turn-on of P6 causes the turn-on of N7. When $A_1$ is high (i.e. $\overline{A_1}$ is low) P5 and P8 are turned-off while N5 is turned-on. Hence Z4 is clamped to ground via the conduction paths of N7 and N5. When $\overline{A_1}$ is low (i.e. $A_1$ is high) N5 is turned-off and P8 is turned-on tending to clamp Z4 to $V_{DD}$ (high) regardless of the value of Z3. When $A_0$ is low ($\overline{A_0}$ is high) P6 is turned-off and N6 is turned-on. The turn-on of N6 causes the turn-off of N7 and tends to turn-on P7. Thus when either one (or both) $\overline{A_1}$ and $\overline{A_0}$ is low, the output Z4 is driven high.

Clearly the logical response of gate G4 in FIG. 2 is the same as the response of gate NG4 in FIG. 1. Additional examination of G4 indicates that when Z3 and $A_1$ are both high, the output Z4 is clamped at, or close to, ground potential via N7 and N5. When either one, or both, of Z3 and $\overline{A_1}$ is low the output Z4 is high being clamped to $V_{DD}$ via P8 and/or P7. Z4 may then be expressed in terms of $Z3$ and $A_1$ as follows:

$$Z4 = \overline{Z3 \cdot A_1} \qquad \text{eq. 9}$$

Inserting the value of Z3, which is equal to $A_0 \cdot A_1$, into eq. 9 produces the following:

$$Z4 = \overline{\overline{A_0 \overline{A_1}} \cdot A_1} \qquad \text{eq. 10}$$

Equation 10 reduces to the following:

$$Z4 = \overline{(\overline{A_0} + A_1) \cdot A_1} \qquad \text{eq. 11}$$

Equation 11 in turn reduces to:

$$Z4 = \overline{\overline{A_0} \cdot A_1} \qquad \text{eq. 12}$$

Z4 in equation 12 is identical to Z4 in equation 4, above, demonstrating mathematically that Z4 produced by G4 in FIG. 2 is logically equivalent to Z4 produced in NG4 of FIG. 1. Hence, the outputs Z2 and Z4 produced in FIG. 2 are logically identical to the outputs Z2 and Z4 produced in the second and fourth stages of the circuit of FIG. 1. However, as noted above, in the circuit of FIG. 2, the outputs Z2 and Z4 are produced without the need to generate the $\overline{A_0}$ signal and without the need for a line to distribute the $\overline{A_0}$ signal throughout the circuit. It is evident that in comparison to the circuit of FIG. 1, the circuit of FIG. 2 requires only one inverter and three (3) bus lines as compared to two (2) inverters and four (4) bus lines for the circuit of FIG. 1.

For ease of discussion, the invention has been illustrated in FIG. 2 for the case of decoding two input variables. It should be evident that the invention is applicable to higher level decoders and, in general, may be used to decode N variables where N is an integer greater than 1.

Figure 3:
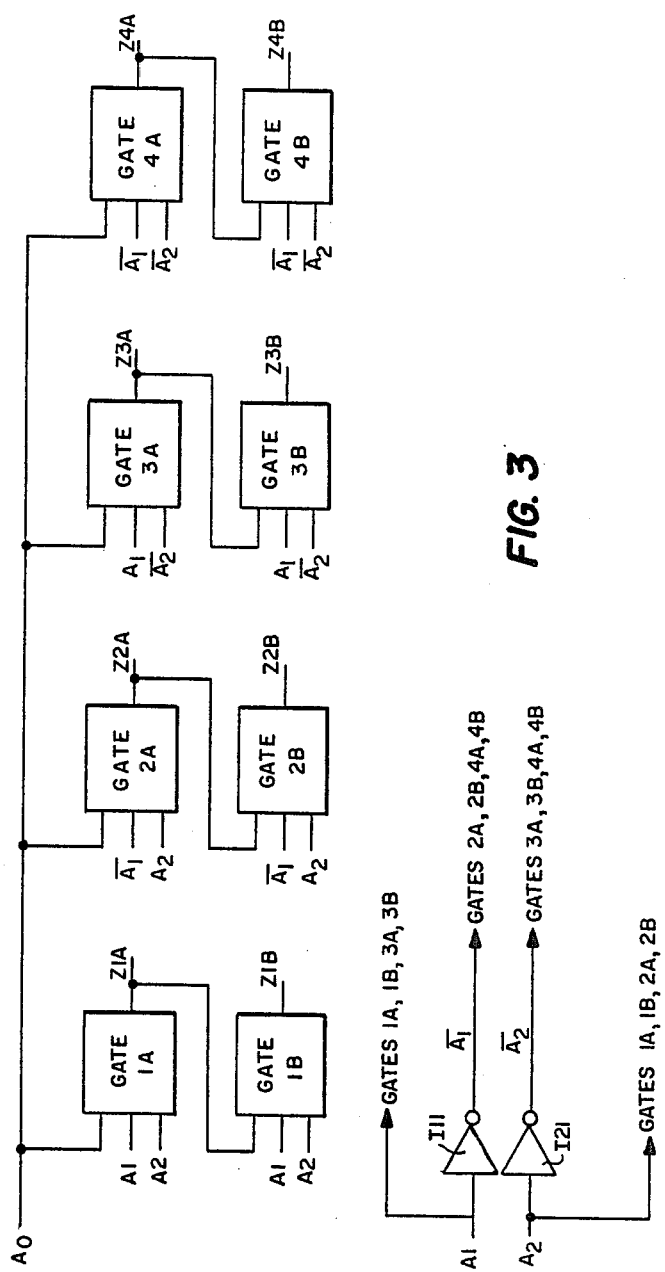
FIG. 3 is a block diagram of a decoder circuit embodying the invention.

The circuit of FIG. 3 shows the decoding of N variables, where N is equal to 3. To decode the N (e.g. 3) variables requires $2^N$-(e.g. 8)-logic gates each having N (e.g. 3) inputs and at least one output. In circuits embodying the invention, as illustrated in FIG. 3, the $2^N$ logic gates are arranged into $2^{N-1}$ (e.g. 4) pairs of logic gates (e.g. G1A, G1B; G2A, G2B; G3A, G3B; and G4A, G4B). N−1 of the input variables (e.g. $\overline{A_1}$ and $\overline{A_2}$ in FIG. 3) are applied to (N−1) inverters (e.g. I11 and I21) to produce the complements (e.g. $\overline{A_1}$ and $\overline{A_2}$) of the N−1 variables. The N−1 input variables and their N−1 complements (e.g. $A_1$, $\overline{A_2}$, $A_1$, $\overline{A_2}$) are arranged into $2^{N-1}$ (e.g. 4) unique combinations or sets of (N−1) signals (e.g. $A_1$ and $A_2$; $\overline{A_1}$ and $A_2$; $\overline{A_1}$ and $\overline{A_2}$; $A_1$ and $\overline{A_2}$). Each unique combination is applied to N−1 inputs of each gate of a pair of the $2^{N-1}$ logic gates. Thus, in FIG. 3, inputs $A_1$ and $A_2$ are applied to two inputs of three-input logic gates 1A and 1B. Inputs $A_1$ and $\overline{A_2}$ are applied to two inputs of three-input logic gates 2A and 2B. Inputs $\overline{A_1}$ and $\overline{A_2}$ are applied to two inputs of three-input logic gates 3A and 3B. Inputs $\overline{A_1}$ and $A_2$ are applied to two inputs of logic gates 4A and 4B. The Nth input variable (e.g. $A_0$) is applied to the Nth input (e.g. the third input) of one gate in each pair of gates. Thus, in FIG. 3, $A_0$ is applied to the Nth (e.g. third) input of gates 1A, 2A, 3A and 4A.

The output (e.g. Z1A, Z2A, Z3A, Z4A) of the one gate in each pair of gates is applied to the Nth (e.g. third) input of the logic gate with which it is paired. Thus, the output Z1A of gate 1A is applied to the third input of gate 1B. The output Z2A of gate 2A is applied to the third input of gate 2B. The output Z3A of gate 3A is applied to the third input of gate 3B and the output Z4A of gate 4A is applied to the third input of gate 4B.

The application of Z1A to the input of gate 1B, the application of Z2A to gate 2B, the application of Z3A to gate 3B and the application of Z4A to gate 4B, is logically equal to the application of the signal $\overline{A_0}$ to the third (Nth) input of gates 1B, 2B, 3B and 4B. Consequently, ouputs Z1A through Z4A and outputs Z1B thorugh Z4B define the 8 particular unique outputs of the three input variables $A_0$, $A_1$ and $A_2$ without the need for inverting the input signals $A_0$ and without the need for providing a bus to distribute the signal $\overline{A_0}$ to the different logic gates.

The validity of the invention may be demonstrated mathematically for the three input variable case. Assuming gate 1A to be a three input NAND gate to whose inputs are applied $A_0$, $A_1$ and $A_2$, the output Z1A may be expressed in terms of the gate inputs as follows:

$$Z1A = \overline{A_0 \cdot A_1 \cdot A_2} \qquad \text{eq. 13}$$

As is well known in the art if the three input gate 1B, when $\overline{A_0}$, $A_1$ and $A_2$ as in the prior art circuit, Z1B could be expressed as follows:

$$Z1B = \overline{\overline{A_0} \cdot A_1 \cdot A_2} \qquad \text{eq. 14}$$

For the case where Z1A, A1 and A2 are applied to a three-input NAND gate the output Z1B may be expressed as follows:

$$Z1B = \overline{Z1A \cdot A_1 \cdot A_2} \qquad \text{eq. 15}$$

Substituting the value of Z1A from eq. 13 above yields:

$$Z1B = \overline{\{\overline{A_0 \cdot A_1 \cdot A_2}\} \cdot A_1 \cdot A_2} = \overline{(\overline{A_0} + \overline{A_1} + \overline{A_2}) \cdot A_1 \cdot A_2} \qquad \text{eq. 16}$$

Equation 16 reduces to $$Z1B = \overline{\overline{A_0} \cdot A_1 \cdot A_2} \qquad \text{eq. 17}$$

Thus Z1B from equation 17 is identical to Z1B from equation 14 showing that applying Z1A to one input of logic gate 1B is logically equivalent to the application of $\overline{A_0}$.

A similar analysis can be performed for the other pairs of logic gates and for any decoding system organized according to the scheme set forth in FIG. 3.

Figure 4:
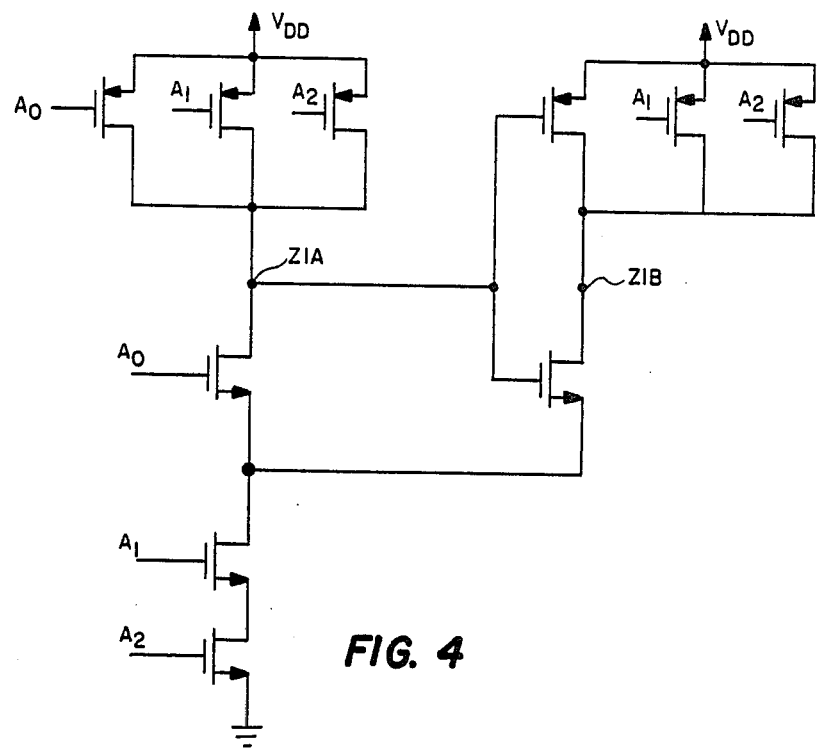
FIGS. 4 and 5 are schematic diagrams of portions of circuitry which may be used to practice the invention.
Figure 5:
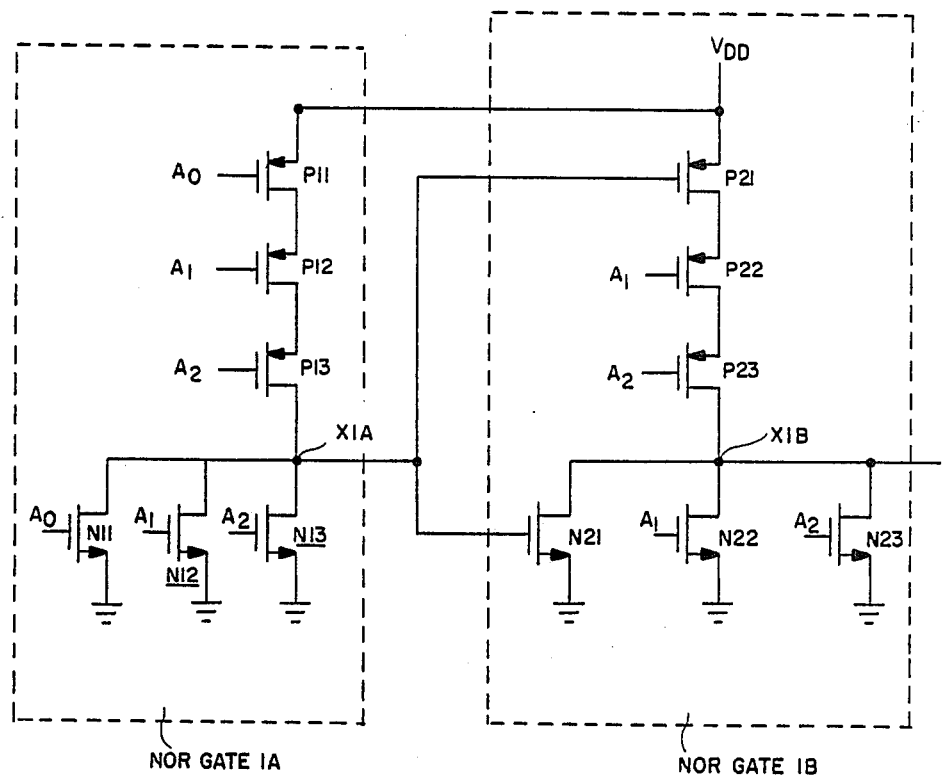

The logic gates 1A through 4A and 1B through 4B may be implemented by NAND gates of the type schematically shown in FIG. 4 or by NOR gates of the type shown schematically in FIG. 5. In general the invention may be practiced using any suitable logic gate whose output has one binary value when all its inputs have the same one binary condition and whose output has the other binary value when all its inputs are not at the one binary condition. Note that the circuitry of FIG. 4 is similar to the circuitry of FIG. 2 except that the circuitry of FIG. 4 includes additional circuitry to decode 3 input variables.

What is claimed is:

1. A decoder circuit for decoding N input variables, where N is an integer greater than 1, comprising:

(N−1) inverters;

means for applying (N−1) of said N input variables to respective ones of said (N−1) inverters for producing the complements of said (N−1) input variables;

$2^N$ logic gates, each logic gate having N inputs and at least one output, the one output of each logic gate having one binary value when all the input variables applied to its inputs have the same one binary value and the output of each logic gate having the other binary value when the input variables applied to all its inputs do not have the same one binary value; said $2^N$ logic gates being paired into $2^{(N-1)}$ pairs of logic gates;

means for applying a different one of sets of (N−1) input variables to the (N−1) inputs of each pair of logic gates, whereby the same (N−1) input variables are applied to the (N−1) inputs of the two logic gates forming a pair of said logic gates, and a different set of (N−1) input variables is applied to each different pair of logic gates;

means for applying the Nth input variable of said N input variables to one input of the one logic gate from each pair of logic gates for producing a signal at the output of said one logic gate which is a unique logic function of the N−1 input variables combined with the Nth input variable; and means coupling the output of said one logic gate of each pair of gates to one input of the second logic gate of that pair of logic gates for producing a signal at the output of the second logic gate of each pair of gates which is a unique function of the N−1 input variables applied to the one and second logic gates of that pair and the complement of said Nth input variable.

2. A decoder circuit comprising:

first, second and third transistors, each transistor having a main conduction path and a control electrode for controlling the conductivity of its conduction path;

means connecting the conduction path of said first transistor between a first node and a second intermediate node;

means connecting the conduction path of said second transistor between said second intermediate node and a first output node;

means connecting the conduction path of said third transistor between said second intermediate node and a second output node;

a first load means connected between said first output node and a point of operating potential;

a second load means connected between said second output node and said point of operating potential;

means for applying a first binary input signal to the control electrode of said first transistor and a second binary input signal to the control electrode of said second transistor for producing a signal at said first output node which is the NAND function of said first and second binary input signals; and means connecting said first output node to the control electrode of said third transistor for producing a signal at said second output node which is the NAND function of the combination of said first binary input signal and the complement of said second binary input signal.

3. The combination as claimed in claim 2 wherein said first, second and third transistors are of first conductivity type;
wherein said first load means includes fourth and fifth transistors of second conductivity type complementary to said first conductivity type, said fourth and fifth transistors having their conduction path connected in parallel between said first output node and said point of operating potential.

4. The combination as claimed in claim 3 wherein said second load means includes sixth and seventh transistors of said second conductivity type having their conduction paths connected in parallel between said second output node and said point of operating potential.

5. A decoder circuit comprising:
first, second and third transistors of one conductivity type, and fourth, fifth, sixth and seventh transistors of second conductivity type; each transistor having a source electrode and a drain electrode defining the ends of a conduction path and a control electrode for controlling the conductivity of its conduction path;
means connecting the conduction path of said first transistor between a first node and a first intermediate node;
means connecting the conduction path of said second transistor between said intermediate node and a first output node;
means connecting the conduction path of said third transistor between said intermediate node and a second output node;
means connecting the conduction paths of said forth and fifth transistors in parallel between said first output node and a power terminal;
means connecting the conduction paths of said sixth and seventh transistors in parallel between said second output node and said power terminal;
menas for applying a first binary signal to the control electrodes of said first and fourth transistors and means for applying a second binary signal to the control electrodes of said second and fifth transistors for producing an output signal at said first output node which is a NAND function of the combination of said first and second binary signal; and
means for applying said first binary signal to the control electrode of said sixth transistor and means connecting said first output node to the control electrodes of said third and seventh transistors for producing an output signal at said second output node which is the NAND function of the combination of said first binary signal and the complement of said second binary signal.

6. A decoder circuit comprising:
first and second NAND'ing networks, each NAND'ing network having N inputs and an output at which is produced the logical NAND function of the signal applied to its N inputs; where N is greater than one;
means for applying N different binary input signals to said N inputs of said first NAND'ing network;
means for applying N−1 of said N different binary input signals to N−1 inputs of said second NAND'ing network; and
means for connecting the output of said first NAND'ing network to the Nth input of said second NAND'ing network for producing at the output of said second NAND'ing network a signal which is the logical NAND function of the combination of said N−1 input signals and the complement of the Nth signal applied to said first NAND'ing network.

7. A decoder circuit comprising:
first and second NAND'ing networks, each NAND'ing network having N inputs; where N is greater than one;
means for applying the same N−1 input signals to N−1 of the N inputs of said first and second NAND'ing networks;
means for applying an Nth input signal to the Nth input of said first NAND'ing network for producing a first output signal at the output of said first NAND'ing network which is the logical NAND function of said Nth input signals and said N−1 input signals; and
means for connecting the output of said first NAND'ing network to the Nth input of said second NAND'ing network for producing a signal at the output of said second NAND'ing network which is the logical NAND function of the combination of said N−1 input signals and the complement of said Nth input signal.

* * * * *